United States Patent
Chang-Hasnain et al.

(10) Patent No.: US 9,093,818 B2
(45) Date of Patent: Jul. 28, 2015

(54) NANOPILLAR OPTICAL RESONATOR

(75) Inventors: Connie Chang-Hasnain, Palo Alto, CA (US); Forrest Sedgwick, Berkeley, CA (US); Roger Chen, Berkeley, CA (US); Thai-Truong Du Tran, Berkeley, CA (US); Kar Wei Ng, Berkeley, CA (US); Wai Son Ko, Menlo Park, CA (US)

(73) Assignee: The Regents of the University of California, Oakland, CA (US)

( * ) Notice: Subject to any disclaimer, the term of this patent is extended or adjusted under 35 U.S.C. 154(b) by 964 days.

(21) Appl. No.: 13/184,019

(22) Filed: Jul. 15, 2011

(65) Prior Publication Data

US 2014/0353712 A1    Dec. 4, 2014

Related U.S. Application Data

(60) Provisional application No. 61/364,802, filed on Jul. 15, 2010.

(51) Int. Cl.
| | |
|---|---|
| *H01S 5/00* | (2006.01) |
| *H01S 5/10* | (2006.01) |
| *H01S 5/30* | (2006.01) |
| *H01L 33/24* | (2010.01) |
| *H01L 33/30* | (2010.01) |
| *H01L 33/32* | (2010.01) |
| *H01L 33/26* | (2010.01) |
| *H01L 33/00* | (2010.01) |

(52) U.S. Cl.
CPC .......... *H01S 5/1042* (2013.01); *H01L 33/0066* (2013.01); *H01L 33/24* (2013.01); *H01L 33/26* (2013.01); *H01L 33/30* (2013.01); *H01L 33/32* (2013.01); *H01S 5/1075* (2013.01); *H01S 5/3013* (2013.01)

(58) Field of Classification Search
CPC .... H01S 5/1042; H01S 5/1075; H01S 5/1082
See application file for complete search history.

(56) References Cited

U.S. PATENT DOCUMENTS

| | | | | |
|---|---|---|---|---|
| 6,519,271 | B2* | 2/2003 | Kwon et al. | 372/46.01 |
| 6,882,051 | B2* | 4/2005 | Majumdar et al. | 257/746 |
| 2009/0032805 | A1* | 2/2009 | Ty Tan et al. | 257/25 |

OTHER PUBLICATIONS

Miller, D.A.B., "Device requirements for optical interconnects to silicon chips," Proceedings of the IEEE, Jul. 2009, pp. 1166-1185.
Miller, D.A.B., "Rationale and challenges for optical interconnects to electronic chips," Proceedings of the IEEE of the IEEE, vol. 88, Jun. 2000, pp. 728-749.
Feldman, M.R, et al., "Comparison between optical and electrical interconnects based on power and speed considerations," Applied Optics, vol. 27, May 1988, pp. 1742-1751.

(Continued)

*Primary Examiner* — Julio J Maldonado
*Assistant Examiner* — Sean Hagan
(74) *Attorney, Agent, or Firm* — Withrow & Terranova, P.L.L.C.

(57) ABSTRACT

Monolithically integrated optical resonators are disclosed. An optical resonator may be a nanopillar optical resonator that is formed directly on a substrate and promotes a helically-propagating cavity mode. The helically-propagating cavity mode may result in significant reflection or, total internal reflection at an interface of the nanopillar optical resonator and the substrate even if refractive indices of the nanopillar optical resonator and the substrate are the same or similar. As a result, strong optical feedback, and thus strong resonance, may be provided in the nanopillar optical resonator.

22 Claims, 18 Drawing Sheets

(56) References Cited

OTHER PUBLICATIONS

Fang, A.W. et al., "Electrically pumped hybrid AlGaInAs-silicon evanescent laser," Optics Express, vol. 14, Oct. 2006, pp. 9203-9210.

Rong, H. et al., "An all-silicon Raman laser," Nature, vol. 433, Jan. 2005, pp. 292-294.

Rong, et al., "A continuous-wave Raman silicon laser," Nature, vol. 433, Feb. 2005, pp. 725-728.

Van Compenhout, J. et al., "Electronically pumped InP-based microdisk lasers integrated with a nanophotonic silicon-on-insulator waveguide circuit," Optics Express, vol. 15, May 28, 2007, pp. 6744-6749.

Kang, Y. et al., "Monolithic germanium/silicon avalanche photodiodes with 340 GHz gain-bandwidth product," Nat. Photon. vol. 3, Jan. 2009, pp. 59-63.

Assefa, S. et al., "Reinventing germanium avalanche photodetector for nanophotonic on-chip optical interconnects," Nature, vol. 464, Mar. 2010, pp. 80-84.

McCall, S.L. et al., "Whispering-gallery mode microdisk lasers," Applied Physics Letters, vol. 60, Jan. 20, 1992, pp. 289-291.

Nobis, R. et al., "Low-order optical whispering-gallery modes in hexagonal nanocavities," Physical Review A, vol. 72, Dec. 2005, 11 pages.

Wiersig, J., "Hexagonal dielectric resonators and microcrystal lasers," Physical Review A., vol. 67, Nov. 8, 2002, 12 pages.

Moewe, M. et al., "Core shell InGaAs/GaAs quantum well nanoneedles grown on silicon with silicon-transparent emission," Optics Express, vol. 17, May 2009, pp. 7831-7836.

Chen, R. et al., "Second-harmonic generation from a single wurtzite GaAs Nanoneedle," Applied Physics Letters, vol. 96, Feb. 2010, 3 pages.

Moewe, M. et al., "Atomically sharp catalyst-free wurtzite GaAs/AlGaAs nanoneedles grown on silicon," Applied Physics Letters, vol. 93, Jul. 2008, 3 pages.

Chen, R. et al., "Nanolasers grown on silicon," Nature Photonics, Feb. 6, 2011, pp. 170-175.

\* cited by examiner

NANOPILLAR OPTICAL RESONATOR

RELATED APPLICATIONS

This application claims the benefit of provisional patent application Ser. No. 61/364,802, filed Jul. 15, 2010, the disclosure of which is hereby incorporated herein by reference in its entirety.

GOVERNMENT SUPPORT

This invention was made with government support under HR001-10-3-0002 awarded by DARPA, DARPA NACHOS Grant No. W911NF-07-1-0314, NSSEFF Grant No. N00244-09-1-0013, NSSEFF Grant No. N00244-09-1-0080, and MARCO IFC Grant No. RA306-S9. The Government has certain rights in this invention.

FIELD OF THE DISCLOSURE

The present disclosure relates to optical resonators and more particularly relates to a monolithic nanopillar optical resonator.

BACKGROUND

As miniaturization of the semiconductor technology node continues to follow the timeline defined by the International Technology Roadmap for Semiconductors, bottlenecks have begun to arise at the interconnect level. To overcome limitations facing electrical interconnects, optical interconnects have been proposed for on-chip and off-chip communication bandwidth to properly scale with processing speed. Operating at optical frequencies permits much higher bandwidth than existing electrical approaches that rely on complex signal processing algorithms. However, successful implementation of optical interconnects requires active optoelectronic devices integrated onto silicon (Si), the foundation of modern electronics. Such devices include lasers as well as photodetectors. Making such devices compatible with silicon processing technology is economically necessary given the massive silicon infrastructure that currently exists.

Monolithic integration of optically superior Group III-V materials onto silicon is a desirable approach to implement such devices since the indirect band gap of silicon makes it an extremely inefficient light emitter. However, such integration has been limited by large lattice mismatch preventing growth of high-quality Group III-V films on silicon. Another problem facing Group III-V optoelectronic devices on silicon is that silicon and Group III-V materials have highly similar refractive indices. This renders waveguiding and confinement of light in optically active Group III-V structures on silicon a difficult task that must be addressed. Lastly, optoelectronic devices at the nanoscale are of interest since electronic components have already reached nanoscale dimensions. Thus, it is also critical to find a proper means of strongly confining light in structures approaching or below the diffraction limit of light.

As such, there is a need for a monolithically integrated optical resonator that satisfies the aforementioned constraints, thereby paving the way, for instance, for on-chip and high density optoelectronic devices such as, but not limited to, lasers.

SUMMARY

Embodiments of a monolithically integrated optical resonator are disclosed. In one embodiment, the optical resonator is a nanopillar optical resonator that is formed directly on a substrate and promotes a helically-propagating cavity mode. The helically-propagating cavity mode results in significant reflection or, in some embodiments, total internal reflection at an interface of the nanopillar optical resonator and the substrate even if refractive indices of the nanopillar optical resonator and the substrate are the same or similar. As a result, strong optical feedback, and thus strong resonance, is provided in the nanopillar optical resonator. In one embodiment, transverse dimensions of the nanopillar optical resonator are less than a single wavelength or on the order of a single wavelength, where the wavelength is an emission wavelength in air of an active material of which the active core is formed. An axial or vertical length of the nanopillar optical resonator may be either subwavelength (i.e., less than or equal to a single wavelength) or greater than or equal to a single wavelength.

In another embodiment, the optical resonator is a nanopillar optical resonator that is formed directly on a substrate, where the nanopillar optical resonator includes a cylindrical, or pillar-shaped, active core and a shell formed around the active core. While materials of which the substrate and the nanopillar optical resonator are formed may vary, in one embodiment, the substrate is silicon (Si), the active core is formed of indium gallium arsenide (InGaAs), and the shell is formed of gallium arsenide (GaAs). The nanopillar optical resonator promotes a helically-propagating cavity mode, which results in significant reflection or, in some embodiments, total internal reflection at an interface of the nanopillar optical resonator and the substrate even if refractive indices of the nanopillar optical resonator and the substrate are the same or similar. As a result, strong optical feedback, and thus strong resonance, is provided in the nanopillar optical resonator. In addition, in one embodiment, transverse dimensions of the nanopillar optical resonator are less than a single wavelength or on the order of a single wavelength, where the wavelength is an emission wavelength in air of an active material of which the active core is formed. An axial or vertical length of the nanopillar optical resonator may be either subwavelength (i.e., less than or equal to a single wavelength) or greater than or equal to a single wavelength.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 1:
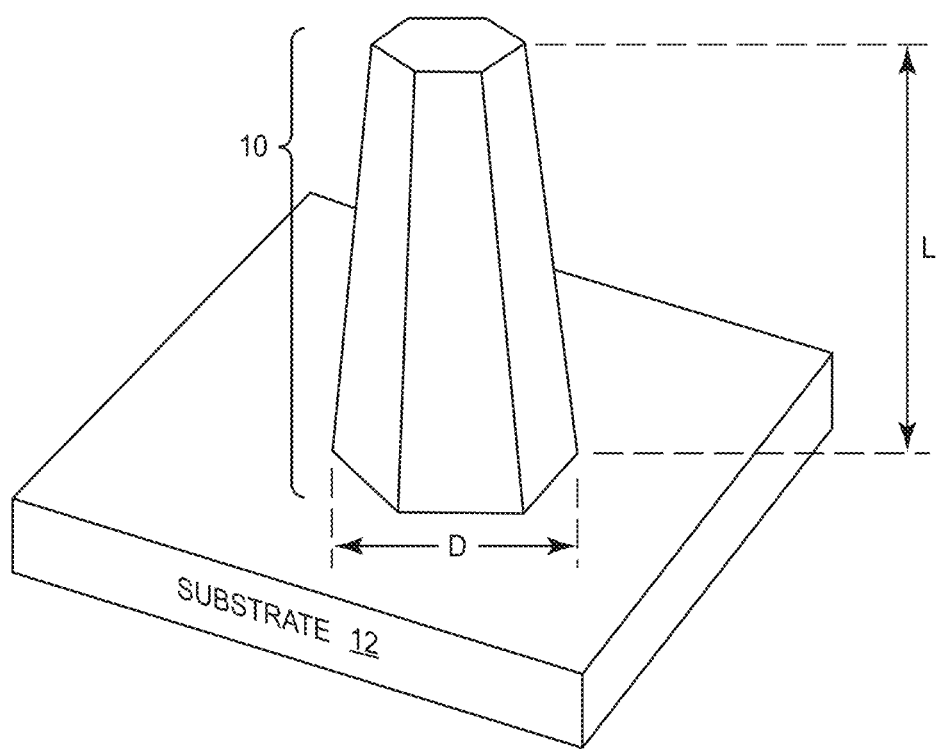
FIG. 1 illustrates a monolithically integrated, or on on-chip, nanopillar optical resonator according to one embodiment of the present disclosure.
Figure 2A:
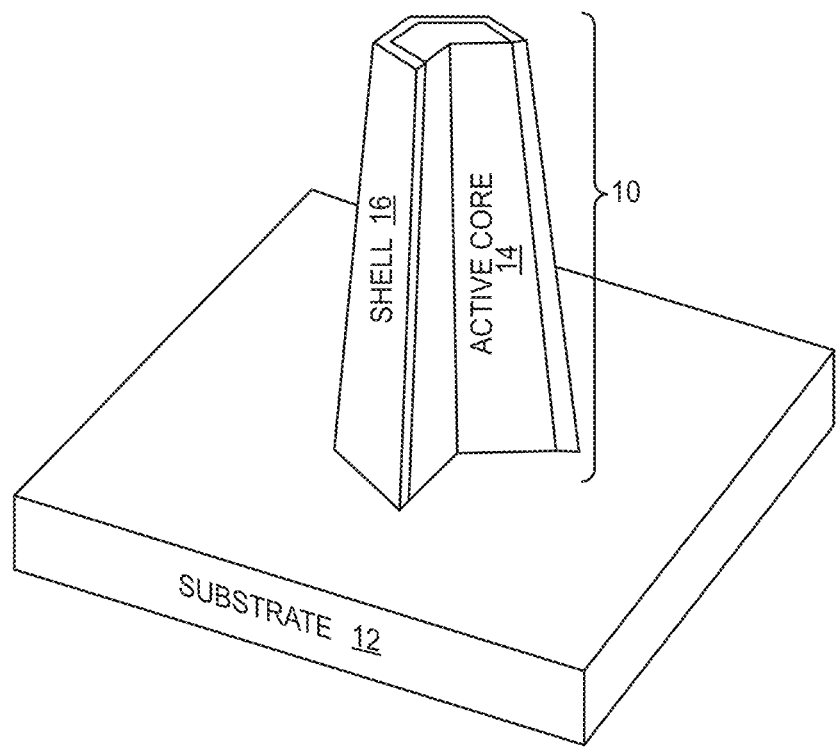
FIGS. 2A and 2B illustrate the nanopillar optical resonator of FIG. 1 in more detail according to one embodiment of the present disclosure.
Figure 2B:
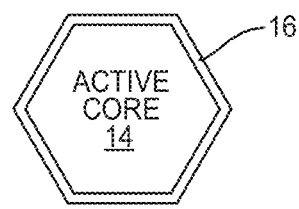
Figure 7:
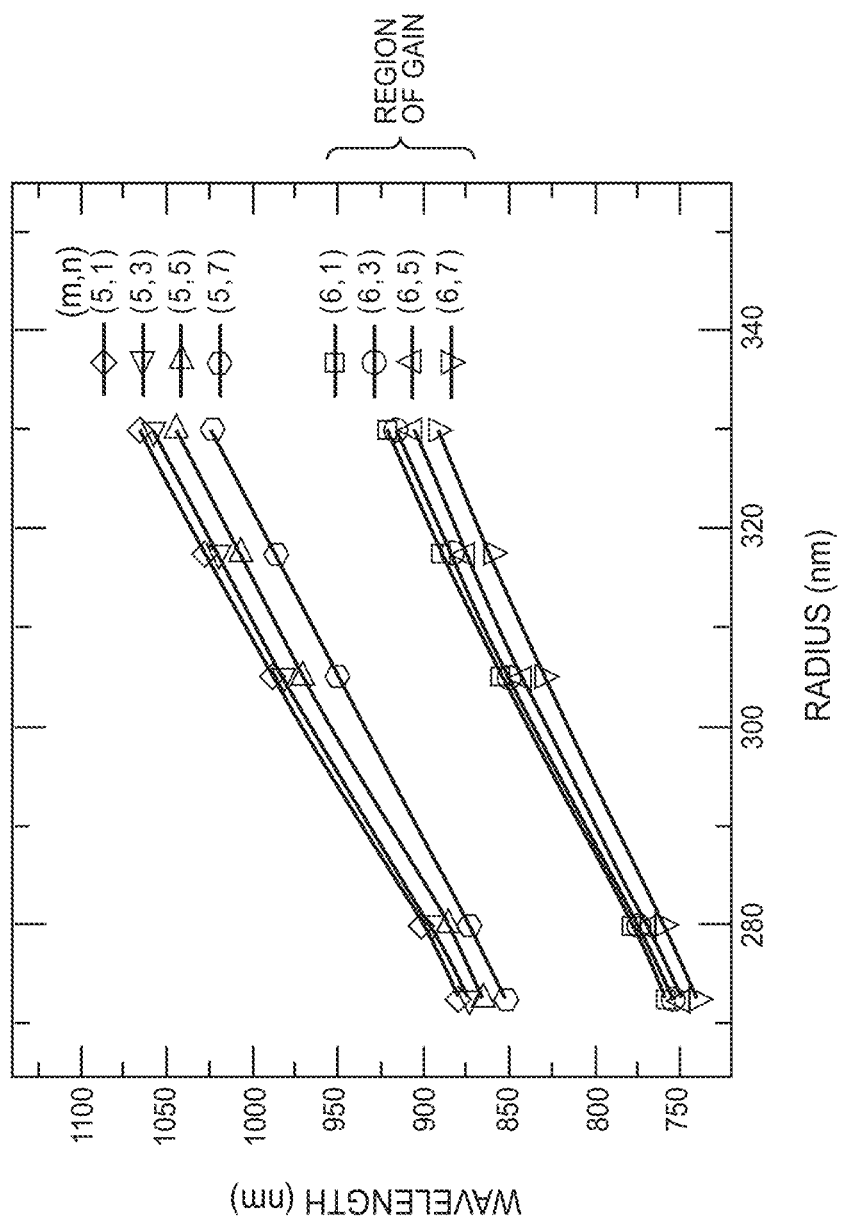
Figure 8:
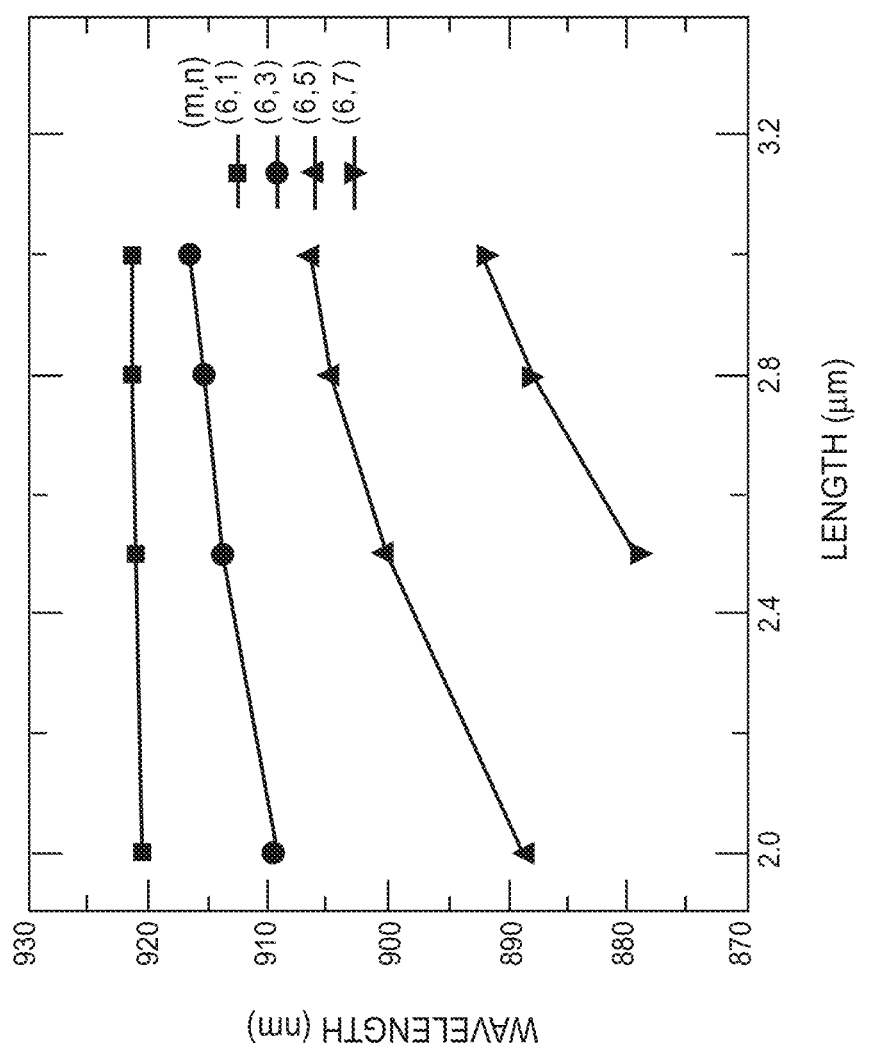
Figures 9A, 9B:
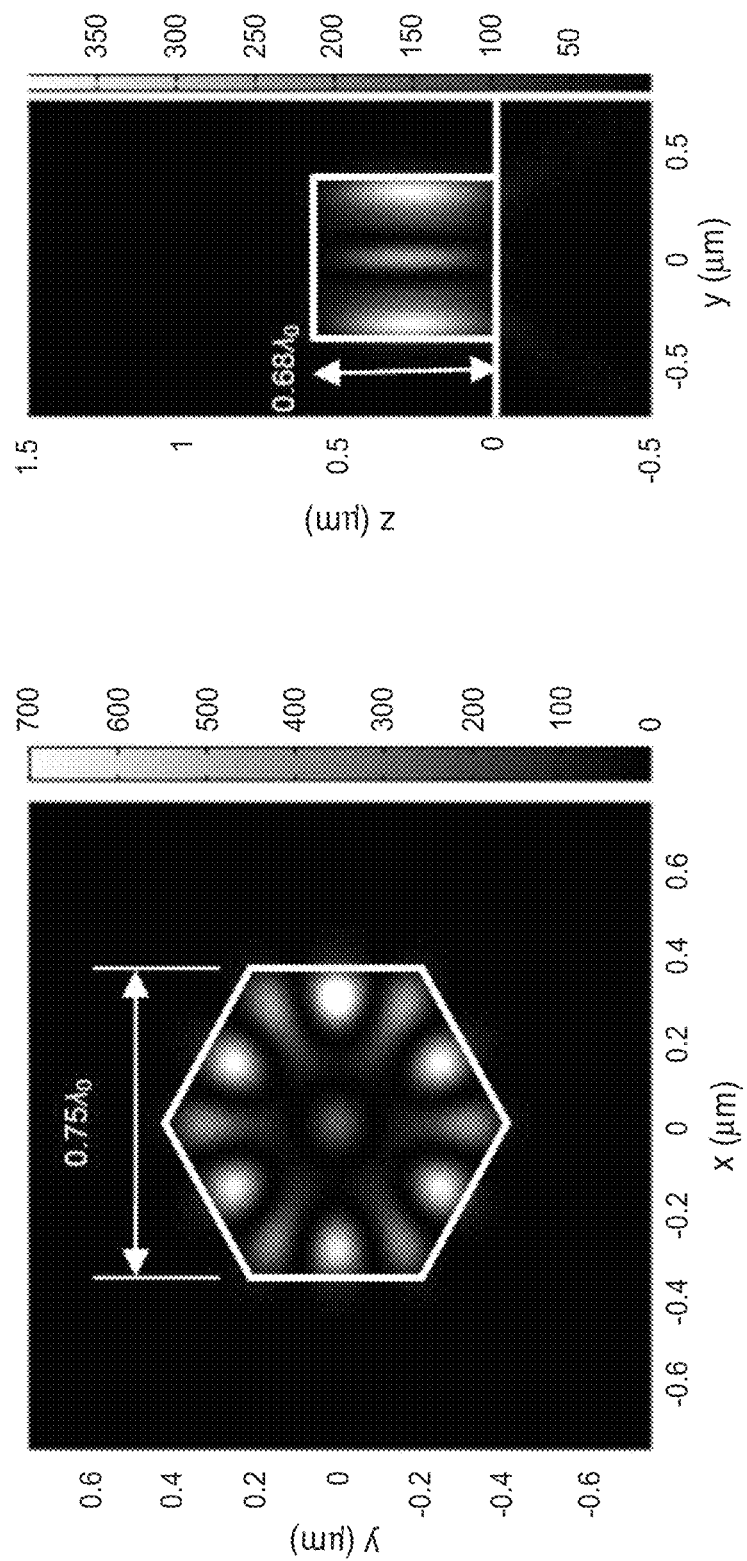
Figures 10A, 10B, 10C:
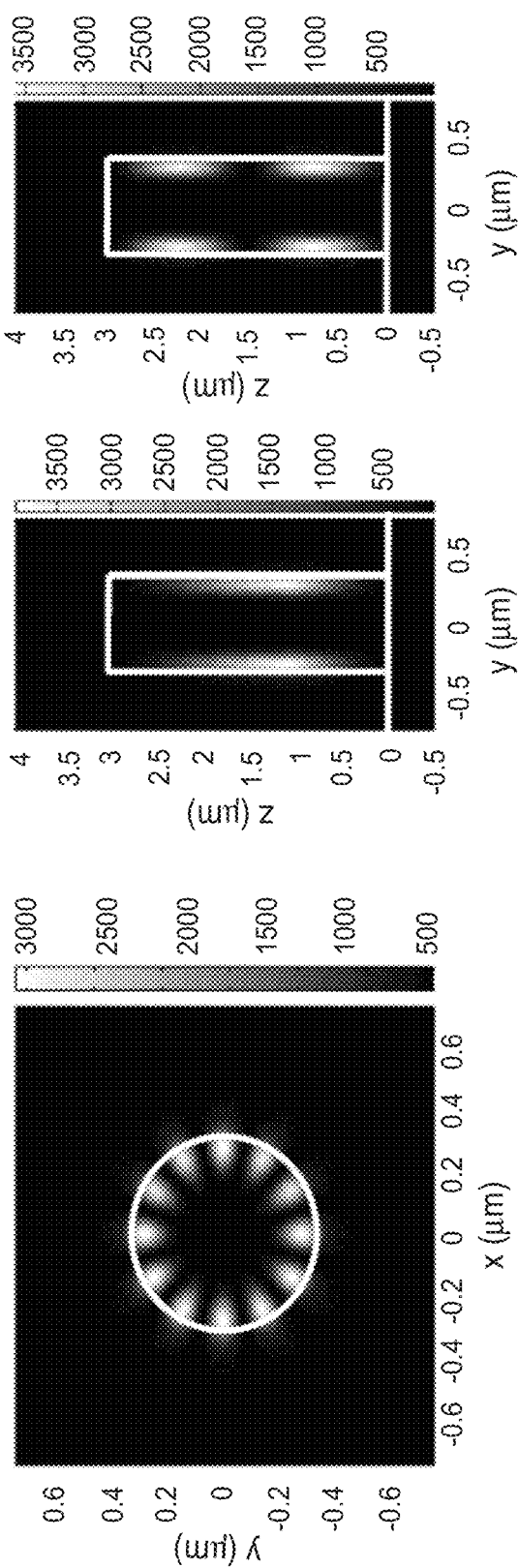
Figure 11:
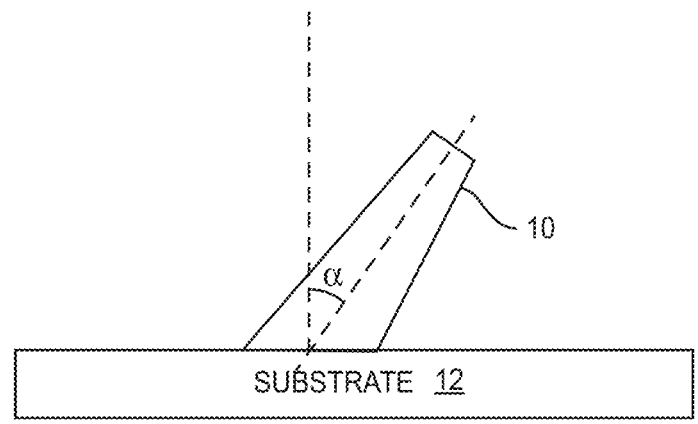
Figure 12:
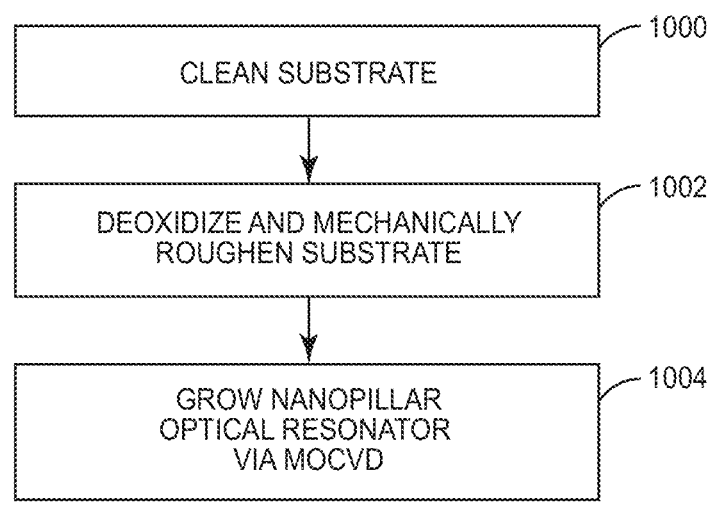
Figure 13A:
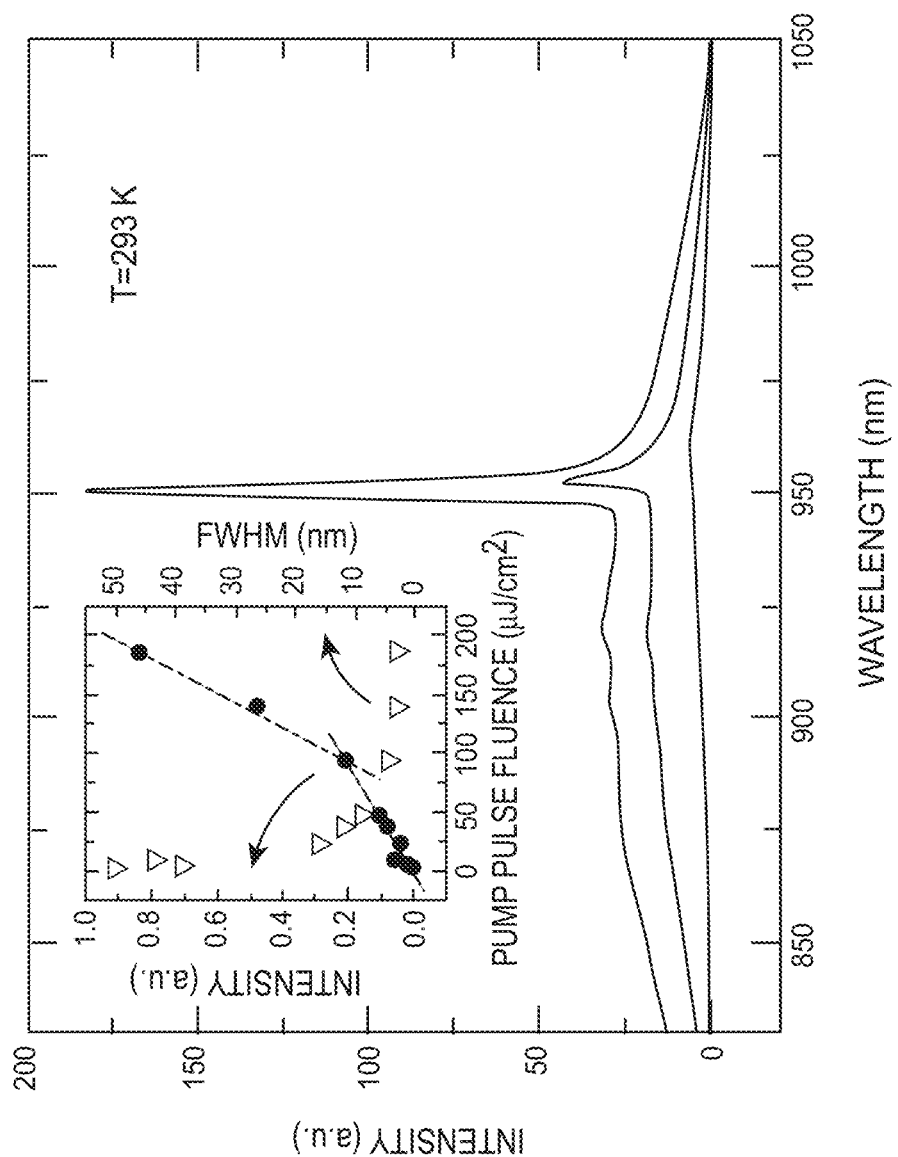
Figure 13B:
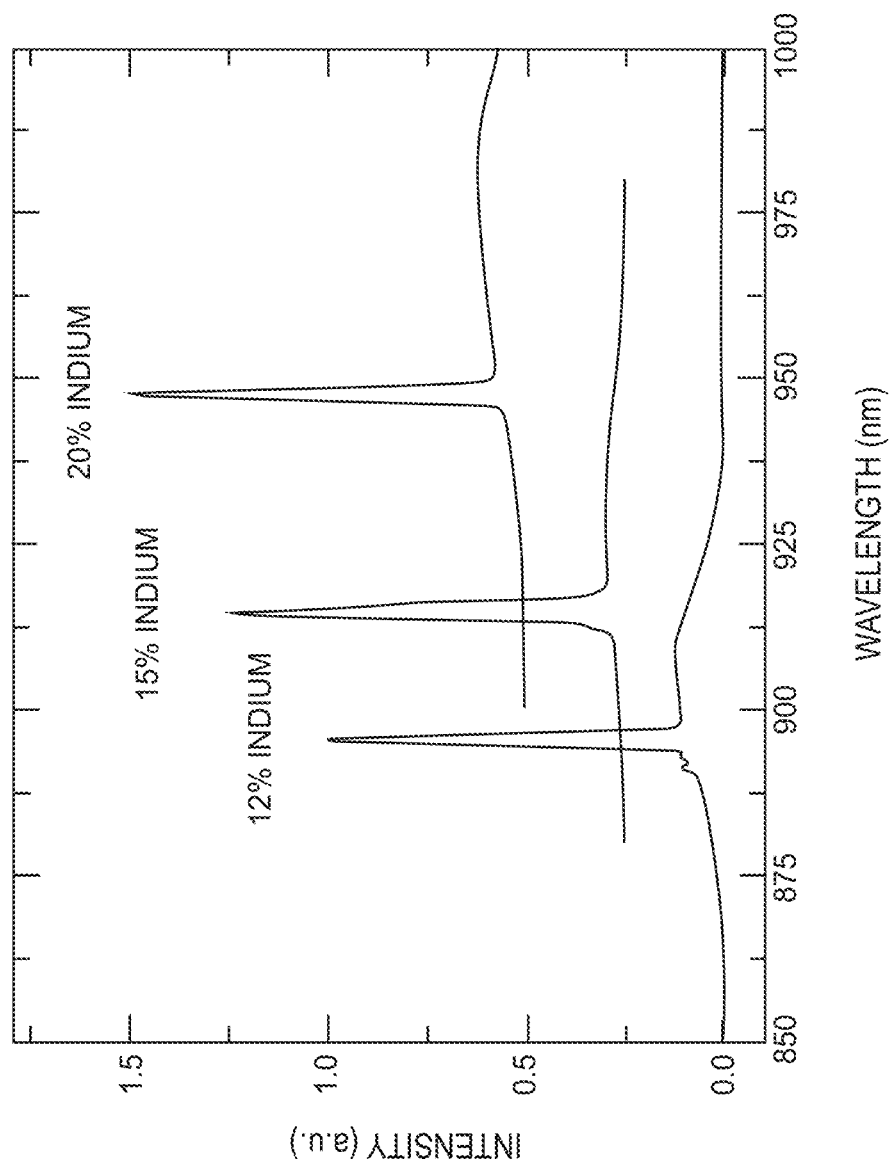
Figure 14:
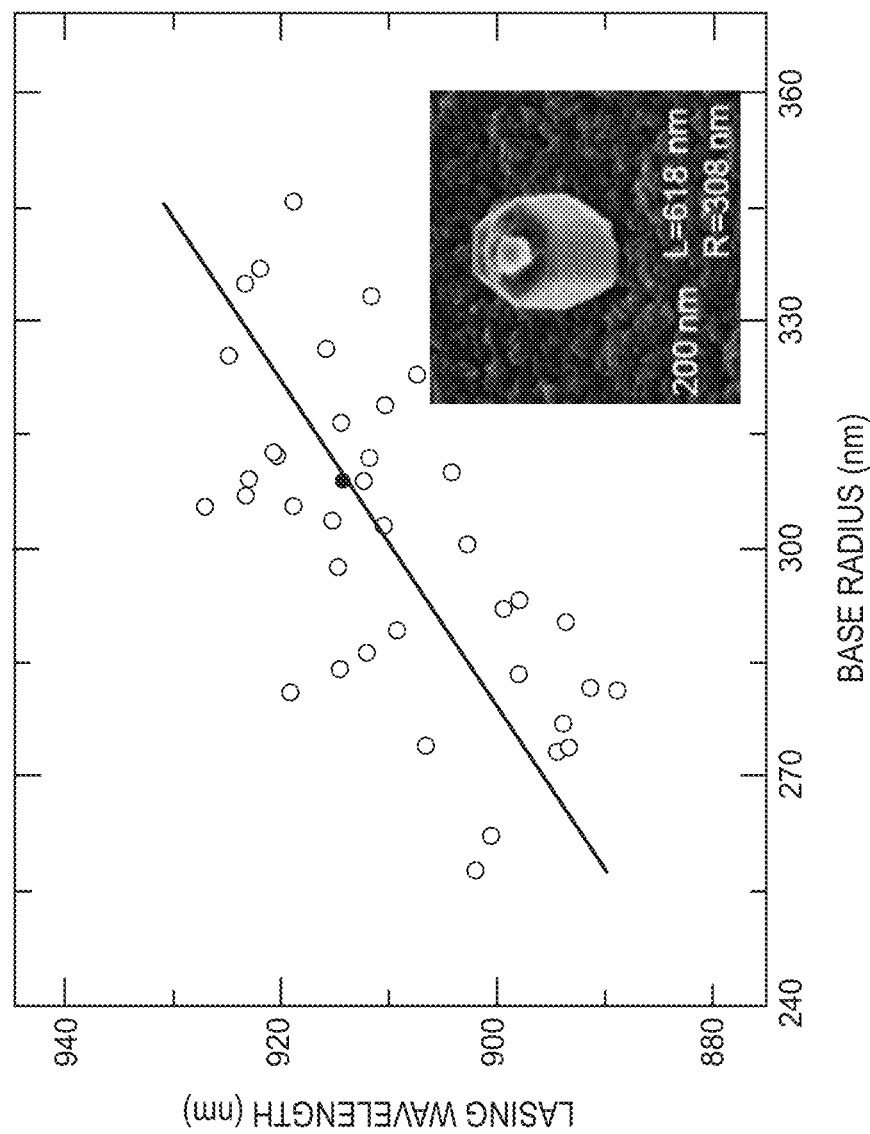
Figure 15:
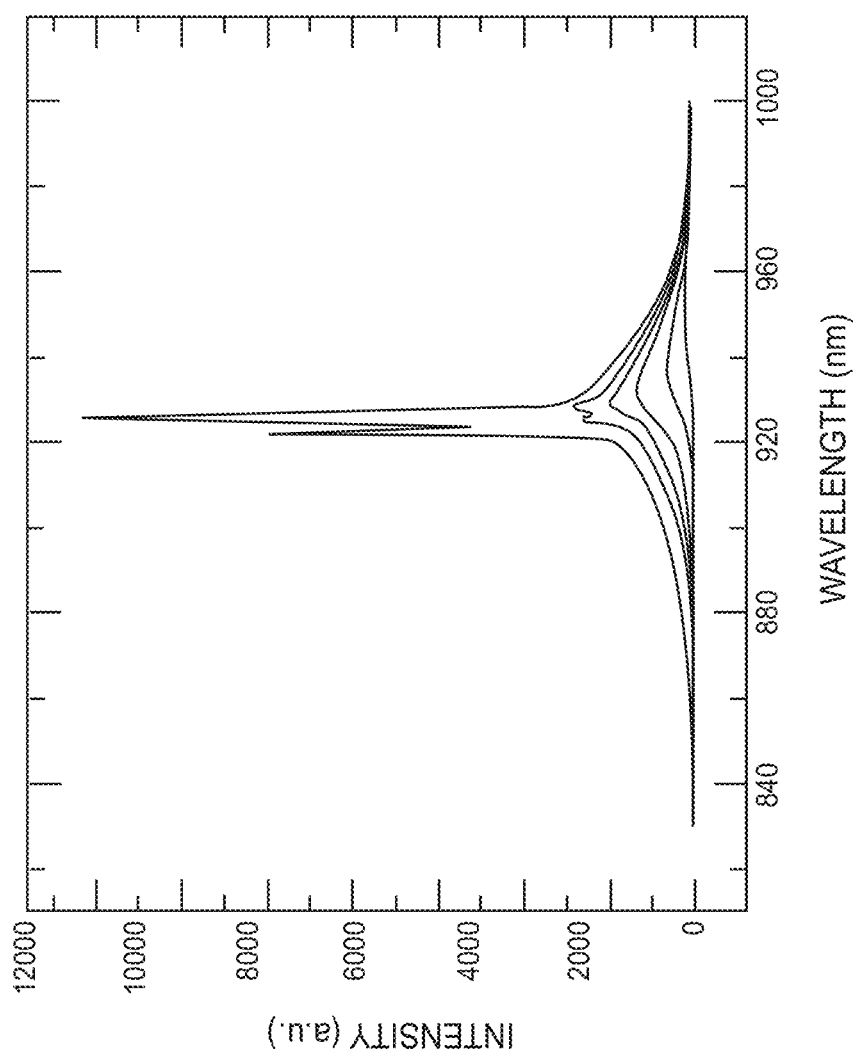
Figure 16A:
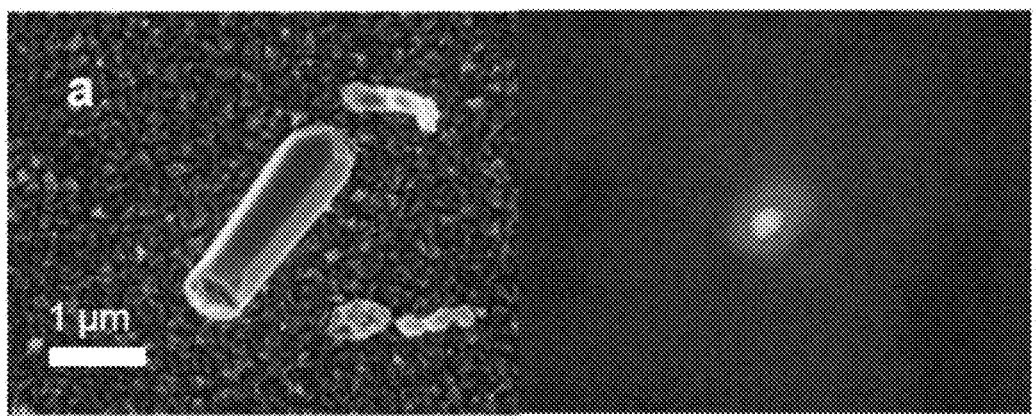
Figure 16B:
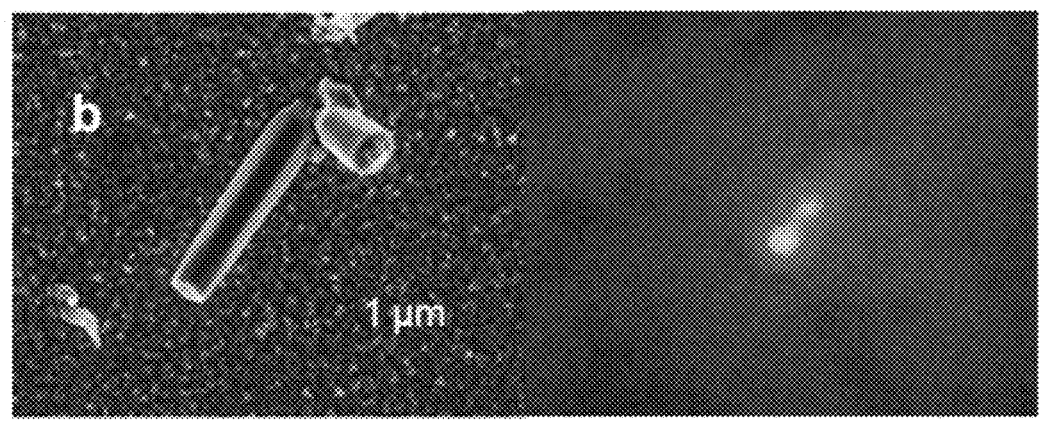
Figure 16C:
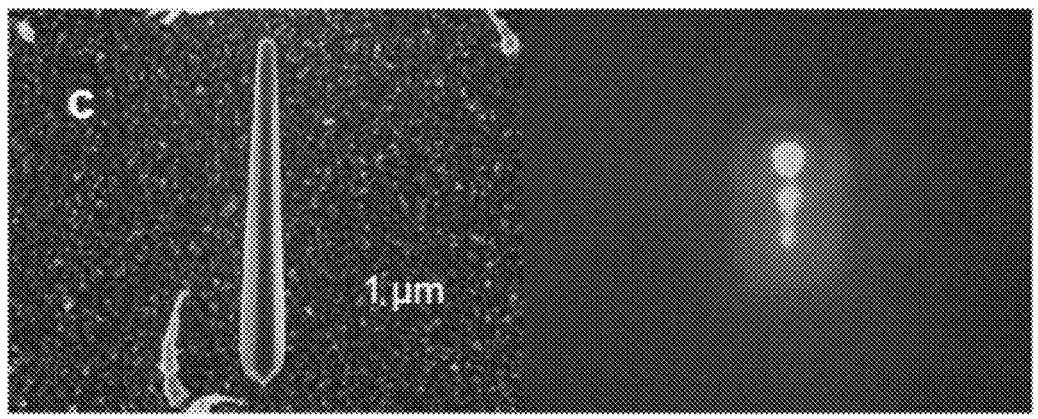
Figure 17:
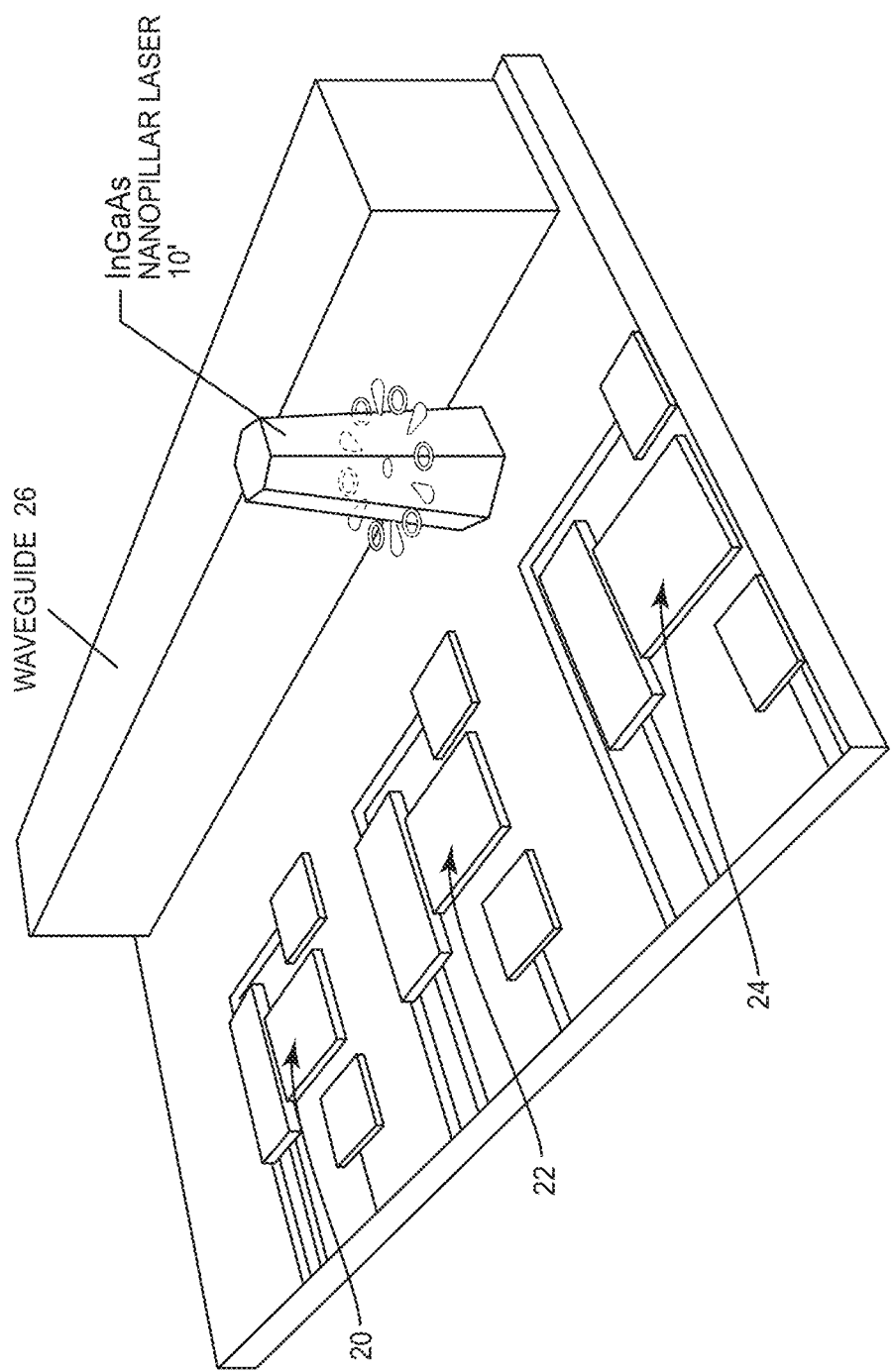

FIG. 7 graphically illustrates the dependence of the resonant wavelength of the nanopillar optical resonator of FIG. 1 and FIGS. 2A and 2B on the radius (R) of the nanopillar optical resonator for various axial mode numbers (n=1, 3, 5, 7) of TM m=5 and TM m=6 modes according to one exemplary embodiment of the present disclosure;

FIG. 8 graphically illustrates the dependence of the resonant wavelength of the nanopillar optical resonator of FIG. 1 and FIGS. 2A and 2B on the length (L) of the nanopillar optical resonator for various axial mode numbers (n=1, 3, 5, 7) of TM m=5 mode according to one exemplary embodiment of the present disclosure;

FIGS. 9A and 9B illustrate electric field properties of an embodiment of the nanopillar optical resonator of FIG. 1 and FIGS. 2A and 2B having all subwavelength dimensions (D and L);

FIGS. 10A through 10C illustrate electric field profiles of the helically-propagating cavity modes for an embodiment of the nanopillar optical resonator having circular symmetry;

FIG. 11 illustrates an embodiment of the nanopillar optical resonator grown at an oblique angle ($\alpha \neq 0°$) from the surface of the substrate according to one embodiment of the present disclosure;

FIG. 12 illustrates an exemplary process for fabricating a nanopillar optical resonator according to one embodiment of the present disclosure;

FIGS. 13A and 13B graphically illustrate nanopillar laser oscillation for exemplary embodiments of the nanopillar optical resonator;

FIG. 14 graphically illustrates lasing wavelength versus radius for an exemplary embodiment of the nanopillar optical resonator;

FIG. 15 illustrates nanopillar laser oscillation for a subwavelength embodiment of the nanopillar optical resonator;

FIGS. 16A through 16C illustrate experimental helically-propagating cavity mode images for an exemplary embodiment of the nanopillar optical resonator; and FIG. 17 illustrates an exemplary Complementary Metal Oxide Semiconductor (CMOS) chip including a monolithically integrated nanopillar optical resonator according to one embodiment of the present disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

The present disclosure describes various embodiments of a monolithically integrated, or on-chip, optical resonator. In general, the optical resonator is a nanopillar optical resonator that is formed directly on a substrate. The nanopillar optical resonator promotes a helically-propagating cavity mode, which results in significant reflection or, in some embodiments, total internal reflection at an interface of the nanopillar optical resonator and the substrate even if refractive indices of the nanopillar optical resonator and the substrate are the same or similar. As a result, strong optical feedback, and thus strong resonance, is provided in the nanopillar optical resonator.

FIG. 1 illustrates a monolithically integrated nanopillar optical resonator 10 according to one embodiment of the present disclosure. As illustrated, the nanopillar optical resonator 10 is formed directly on a substrate 12. In one embodiment, the nanopillar optical resonator 10 is formed of a Group III-V semiconductor material such as, for example, an arsenide (As) based, nitrogen (N) based, or phosphorous (P) based Group III-V semiconductor material; a Group II-V semiconductor material such as, for example, zinc oxide (ZnO); or the like. The substrate 12 may be, for example, a gallium arsenide (GaAs) substrate, an indium phosphide (InP) substrate, a silicon-on-insulator (SOI) substrate, a sapphire substrate, a glass substrate, or some alloy thereof.

In the preferred embodiment, transverse dimensions (D) of the nanopillar optical resonator 10 are subwavelength (i.e., less than a single wavelength ($\lambda_0$)) or on the order of a single wavelength. An axial or vertical length (L) of the nanopillar optical resonator 10 can be either subwavelength (i.e., less than a single wavelength ($\lambda_0$)) or greater than or equal to a single wavelength ($\lambda_0$). Here, the wavelength ($\lambda_0$) is an emission wavelength in air of an active material of the nanopillar optical resonator 10. Notably, while many of the figures included herein (including FIG. 1) depict the nanopillar optical resonator 10 as a cylinder having hexagonal symmetry (i.e., a hexagonal cylinder or a cylinder having a hexagonal cross-sectional area), the nanopillar optical resonator 10 may have any type of cylindrical, or pillar, geometry having three or more sides (e.g., circular cylinder, hexagonal cylinder, dodecagonal cylinder, or the like). It should also be noted that, as used herein, the terms "cylindrical" and "cylinder" are not limited to right circular cylindrical/cylinders (i.e., a cylinder having a circular cross section and sides that are perpendicular, or at right-angles, thereto). Rather, the terms "cylindrical" and "cylinder" are used in their broader senses to refer to a three-dimensional geometric solid bounded by two parallel geometric shapes (e.g., circles, hexagons, dodecagons, or the like) of equal or non-equal sizes and a curved surface formed by moving a straight line so that its ends lie on the two parallel geometric shapes.

The nanopillar optical resonator 10 may be formed on the substrate 12 using any suitable fabrication process. Preferably, the fabrication process utilized to fabricate the nanopillar optical resonator 10 is compatible with a fabrication process used to fabricate any electronic circuitry (e.g., Complementary Metal Oxide Semiconductor (CMOS) devices) that are also formed on the substrate 12.

FIGS. 2A and 2B illustrate the nanopillar optical resonator 10 of FIG. 1 in more detail according to one embodiment of the present disclosure. As illustrated, in this embodiment, the nanopillar optical resonator 10 includes a cylindrical, or pillar-shaped, active core 14 (hereinafter "active core 14") and a shell 16. The active core 14 is formed of an active material for the nanopillar optical resonator 10. The active material may be, for example, a Group III-V semiconductor material such as, for example, an arsenide (As) based, nitrogen (N) based, or phosphorous (P) based Group III-V semiconductor material; a Group II-V semiconductor material such as, for example, zinc oxide (ZnO); or the like. The active core 14 can be a bulk, quantum well, quantum dot, or similar structure so long as the active core 14 is fashioned in a nanopillar cavity geometry that promotes or supports helically-propagating modes (discussed below). The shell 16 operates to passivate the surface of the active core 14 (i.e., suppress surface recombination) and aids in achieving room temperature lasing. In one particular embodiment, the active core 14 is formed of indium gallium arsenide (InGaAs), and the shell 16 is formed of gallium arsenide (GaAs).

Figure 3A:
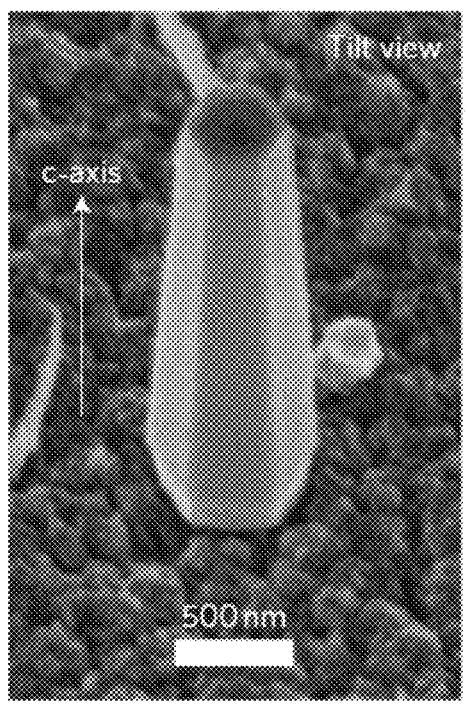
FIGS. 3A and 3B are scanning electron microscope (SEM) images of an exemplary, non-limiting implementation of the nanopillar optical resonator of FIG. 1 and FIGS. 2A and 2B.
Figure 3B:
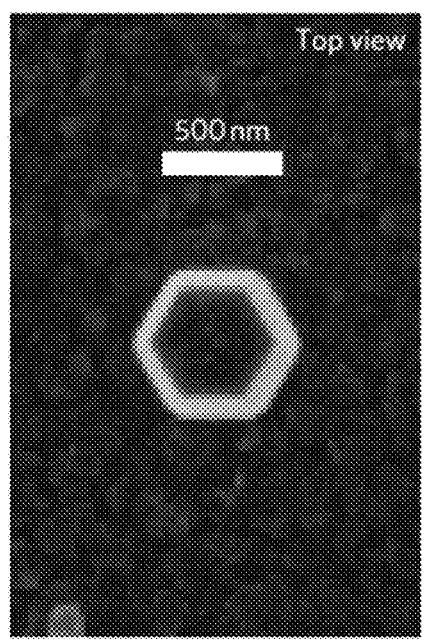

FIGS. 3A and 3B are scanning electron microscope (SEM) images of an experimentally implemented embodiment of the nanopillar optical resonator 10 of FIGS. 1, 2A, and 2B. In this embodiment, the substrate 12 is a silicon substrate, and the nanopillar optical resonator 10 includes an InGaAs active core 14 and a GaAs shell 16 formed on the silicon substrate 12 using monolithic metalorganic chemical vapor deposition (MOCVD) growth. FIG. 3A is a tilt-view of the nanopillar optical resonator 10, and FIG. 3B is a top-down view of the nanopillar optical resonator 10.

The nanopillar optical resonator 10 of FIGS. 1, 2A, 2B, 3A, and 3B provides a novel optical feedback mechanism. More specifically, the nanopillar optical resonator 10 promotes a helically-propagating cavity mode. A strong azimuthal component of the helically-propagating cavity mode results in observation of whispering gallery (WG) effects in the nanopillar optical resonator 10. However, typical WG cavity modes propagate only in the azimuthal direction. In contrast, in the nanopillar optical resonator 10, net propagation of the helically-propagating cavity mode also exists in the axial direction. The result is that the nanopillar optical resonator 10 supports axially propagating modes akin to Fabry-Perot (FP) resonances, but has transverse mode patterns akin to WG resonances. Thus, the helically-propagating cavity mode promoted by the nanopillar optical resonator 10 effectively hybridizes WG and FP effects (i.e., has both transverse propagation characteristics and axial propagation characteristics). Notably, WG optical resonators use index confinement of the optical mode in the vertical direction by having the resonator situated on a pedestal such that a semiconductor-air interface lies under high intensity regions of the mode. In contrast, for the nanopillar optical resonator 10, strong resonances are maintained even though the nanopillar optical resonator 10 is directly interfaced with the substrate 12 such that high intensity regions of the mode sit atop a semiconductor-semiconductor interface. Therefore, the optical feedback mechanism provided by the nanopillar optical resonator 10 is ideal for monolithically integrated on-chip resonators (and lasers, etc.) since pedestal fabrication is unnecessary.

Figure 4:
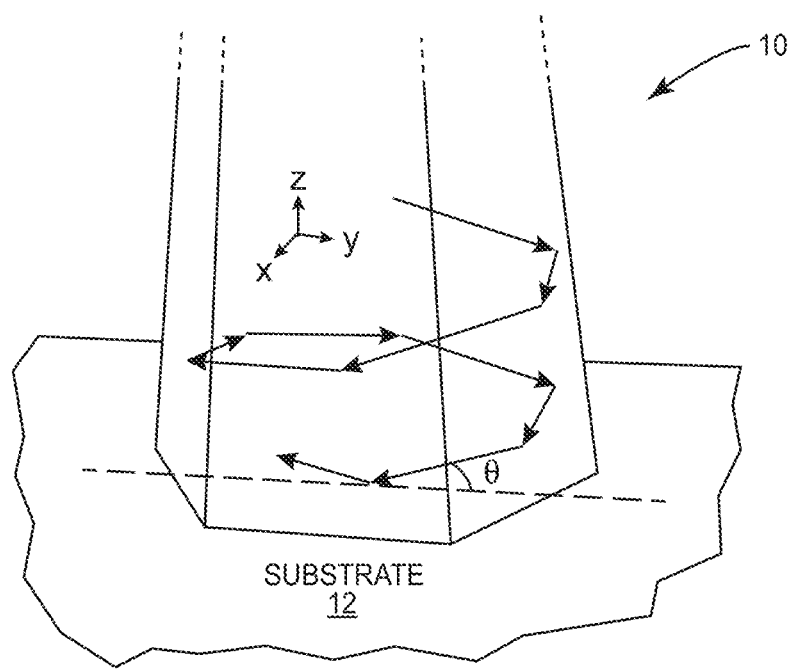
FIG. 4 illustrates a helically-propagating mode promoted by the nanopillar optical resonator of FIG. 1 and FIGS. 2A and 2B according to one embodiment of the present disclosure.

The helically-propagating cavity mode can be physically interpreted using ray optics as shown in FIG. 4. The helically-propagating cavity mode is much like a WG resonance in nature, but it also possesses a finite longitudinal wavevector component. This results in a helical ray path such that the wavevector of the helically-propagating cavity mode strikes the substrate 12 at a very shallow angle ($\theta$). As a result of the helically-propagating mode and more specifically as a result of the very shallow angle ($\theta$) at which the wavevector of the helically-propagating cavity mode strikes the substrate 12, significant internal reflection (e.g., greater than or equal to 30% internal reflection), and in some embodiments, total internal reflection occurs at an interface between the nanopillar optical resonator 10 and the substrate 12. Indeed, the helically-propagating mode promoted by the nanopillar optical resonator 10 results in significant, and in some embodiments total, internal reflection even if the nanopillar optical resonator 10 and the substrate 12 have the same or similar indices of refraction. For example, the nanopillar optical resonator 10 results in high or even total internal reflection in the embodiment where the active core 14 is InGaAs (index of refraction $n_r \approx 3.7$) and the substrate 12 is silicon ($n_r \approx 3.6$).

It should be noted that in one embodiment, the angle ($\theta$) at which the helically propagating cavity mode strikes the substrate 12 is less than or equal to $90°-(\arcsin(n2/n1)\times 180°/\pi)$, where n1 is the refractive index of the nanopillar optical resonator 10 and n2 is the refractive index of the substrate 12. This condition results in total internal reflection. Thus, for example, if the active material of the nanopillar optical resonator 10 is InGaAs and the substrate 12 is silicon, then the angle ($\theta$) of incidence for total internal reflection is less than or equal to $90°-76°=14°$. It should also be noted that, in another embodiment, the amount of internal reflection provided by the helically propagating cavity mode is at least 30% even without total internal reflection. In this condition, the angle ($\theta$) may be greater than or equal to $90°-(\arcsin(n2/n1)\times 180°/\pi)$ so long as greater than 30% reflection is still achieved. Still further, in one embodiment, the amount of internal reflection provided by the helically propagating cavity mode is at least 30% with greater than 10× (10 times) less contrast in the indices of refraction of the nanopillar optical resonator 10 and the substrate 12 than if traditional FP modes are used to achieve 30% reflection. Furthermore, in one embodiment, the internal reflection provided by the helically propagating cavity mode is at least 100× (100 times) more than the internal reflection provided by traditional FP cavity modes for the same small refractive index contrast.

Figure 5C:
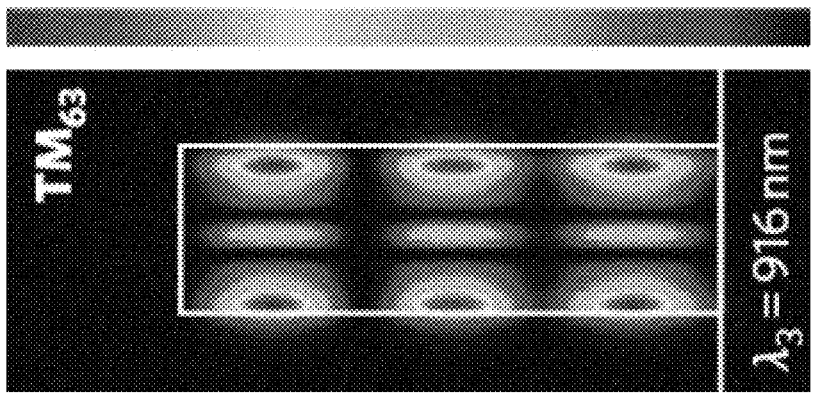
FIGS. 5A through 5C are transverse magnetic (TM) helically-propagating cavity mode profiles for the nanopillar optical resonator of FIG. 1 and FIGS. 2A and 2B according to one exemplary embodiment of the present disclosure.
Figure 5B:
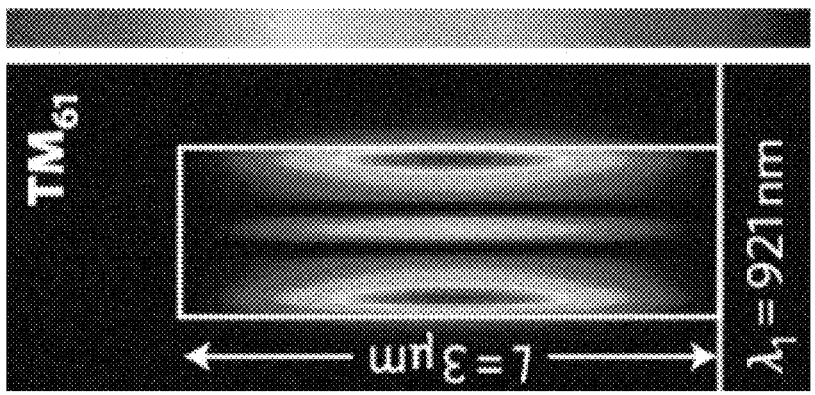
Figure 5A:
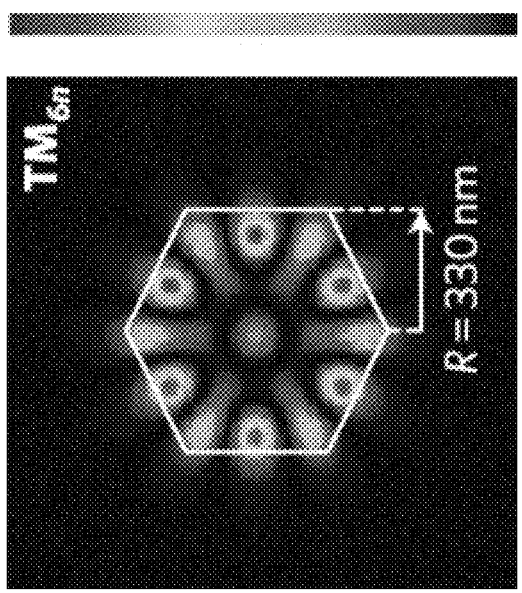

FIGS. 5A through 5C are transverse magnetic (TM) helically-propagating cavity mode profiles for the nanopillar optical resonator 10 according to one exemplary embodiment of the present disclosure. This analysis is based on finite-difference time-domain (FDTD) calculations for an untapered nanopillar optical resonator 10 having an InGaAs active core 14 and a GaAs shell 16 on a silicon substrate 12. For dimensions of $D\sim 0.7\lambda_0$ (i.e., $R\sim 0.35\lambda_0$) and $L\sim 0.6\lambda_0$ to $4\lambda_0$, the nanopillar optical resonator 10 supports $6^{th}$ order TM hexagonal WG mode pattern. For a 330 nanometer (nm) radius (R), this mode resonates at 921 nm. FIG. 5A illustrates a transverse field profile for the $6^{th}$ order TM ($6^{th}$ azimuthal order) helically-propagating cavity mode. FIGS. 5B and 5C illustrate cross-sectional field profiles along the longitudinal direction for the fundamental axial mode and a higher-order axial mode (n=3). From these figures, it is evident that the helically-propagating cavity mode is strongly confined within the nanopillar optical resonator 10 (and away from the substrate 12) in all directions. Notably, in FIGS. 5B and 5C, different orders of standing wave patterns can be seen along the axis of the nanopillar optical resonator 10, substantiating axial as well as azimuthal mode propagation.

It should be noted that the nanopillar optical resonator 10 also provides a high quality factor (Q). In embodiments where tapering of the sides of the nanopillar optical resonator 10 is at 6°, the quality factor is approximately 206. The tapering of the sidewalls decreases the quality factor of the nanopillar optical resonator 10. Without tapering, the quality factor may be as high as approximately 4,300. Note that, generally, higher-order axial modes have lower quality factors. Physically, the stronger FP characteristic of higher-order axial modes means that their effective longitudinal wavevector components become stronger, causing larger penetration and loss into the substrate 12 (assuming similar refractive indices).

Figure 6C:
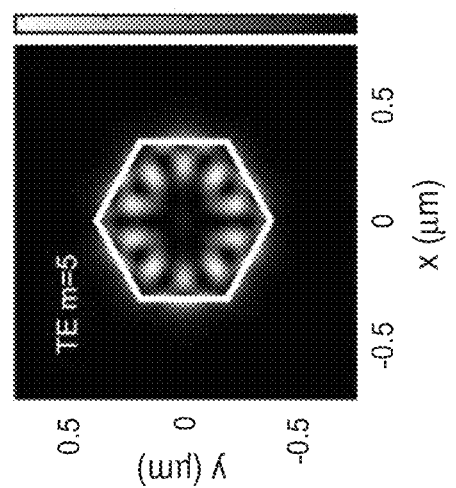
FIGS. 6A through 6C are lower-order and transverse electric helically-propagating cavity mode profiles for the nanopillar optical resonator of FIG. 1 and FIGS. 2A and 2B according to one embodiment of the present disclosure.
Figure 6B:
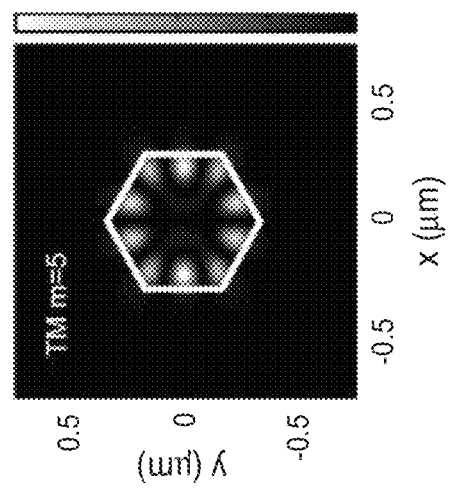
Figure 6A:
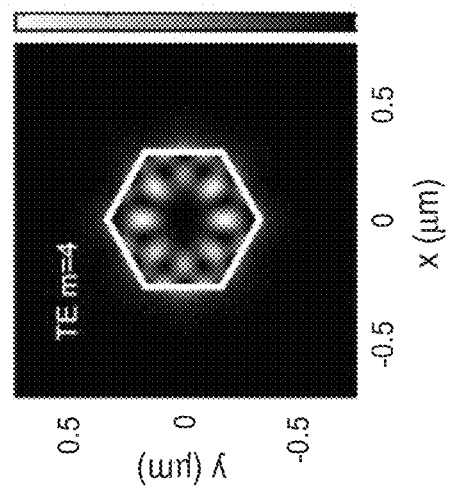

Different resonances with different field patterns operating on the same principle exist for other embodiments of the nanopillar optical resonator 10 having various dimensions, as illustrated in FIGS. 6A through 6C. Transverse electric (TE) helically-propagating cavity modes exist in addition to TM modes. These different modes are properly indexed by azimuthal and axial mode numbers. Azimuthal mode number m describes the transverse field pattern just as it does for traditional WG modes. Notably, in one exemplary embodiment, TM m=5, 6 and TE m=4, 5 are observed in the nanopillar optical resonator 10. The axial mode number n describes the number of maxima in the standing wave patterns along the nanopillar axis (i.e., the order of the axial mode). An axial mode number of n=1 is a subset of the helically-propagating cavity modes that effectively describes traditional WG modes. A specific nanopillar mode (e.g., TM m=6) can be applied throughout visible and near-infrared spectral ranges by scaling the dimensions of the nanopillar optical resonator 10 properly with wavelength.

Given the inherent complexity of obtaining analytical solutions for WG modes, the nanopillar optical resonator 10 may be designed to resonate at a desired wavelength using numerical approaches. Specifically, the following discussion is based on FDTD simulations, though other methods such as finite element method (FEM) may alternatively be used. To excite the modes, a single dipole source is placed at a field maximum of the mode. The source is pulsed and the time decay of the fields in the simulated embodiment of the nanopillar optical resonator 10 is numerically calculated. Fourier analysis of the time decay reveals the frequency properties of the embodiment of the nanopillar optical resonator 10 and thus its resonance. An absorbtive silicon substrate 12 is included in the simulations to account for possible absorption losses near the interface of the nanopillar optical resonator 10 and the substrate 12, though it was found that the helically-propagating cavity modes of the nanopillar optical resonator 10 are so well-defined that absorption in the substrate 12 is minimized.

Since the helically-propagating cavity mode of the nanopillar optical resonator 10 includes both axial and azimuthal propagation, both the length (L) and radius (R=D/2) affect the resonant wavelength of the nanopillar optical resonator 10. FIG. 7 graphically illustrates the dependence of the resonant wavelength of the nanopillar optical resonator 10 on the radius (R) of the nanopillar optical resonator 10 for various axial mode numbers (n=1, 3, 5, 7) of TM m=5 and TM m=6 modes according to one exemplary embodiment of the present disclosure. Similar dependence will exist in other embodiments as well.

As shown, the resonant wavelength shifts quite drastically versus nanopillar radius (R), which attests to the WG properties of the helically-propagating cavity mode promoted by the nanopillar optical resonator 10. As a result, the radius (R) of the nanopillar optical resonator 10 may be controlled or designed to provide a desired resonant wavelength. Note that, in this example, the spectral position of the TM m=5, 6 resonances overlap the exemplary region of gain. However, tapering of the nanopillar optical resonator 10 and dimensional variation may cause other orders of hexagonal WG modes to overlap this gain region for lasing. In particular, in this example, TE m=4, 5 modes also tend to overlap the region of gain.

FIG. 8 graphically illustrates the dependence of the resonant wavelength of the nanopillar optical resonator 10 on the length (L) of the nanopillar optical resonator 10 for various axial mode numbers (n=1, 3, 5, 7) of TM m=6 mode according to one exemplary embodiment of the present disclosure. Similar behavior is expected for other azimuthal mode numbers as well. For the fundamental axial mode (n=1), the resonant wavelength shifts little with change in the length (L) of the nanopillar optical resonator 10, which is expected since the fundamental axial mode is essentially a pure WG mode confined in the longitudinal direction. For progressively higher-order axial modes (n>1), dependence of the resonant wavelength on the length (L) of the nanopillar optical resonator 10 becomes progressively stronger. Physically, the helically-propagating modes are becoming more and more characteristic of FP modes. Thus, FIG. 8 illustrates that the length (L) of the nanopillar optical resonator 10 may also be designed to obtain the desired resonant wavelength.

A great advantage of the helically-propagating cavity modes of the nanopillar optical resonator 10 is their ability to implement laser oscillation in a nanostructure on a substrate of low refractive index contrast. In fact, even lasers with subwavelength volumes can be realized. FIGS. 9A and 9B illustrate electric field properties of an embodiment of the nanopillar optical resonator 10 having all subwavelength dimensions (D and L). Despite such small dimensions, the n=1 order of helically-propagating cavity modes maintains strong light confinement inside the nanopillar optical resonator 10. As such, the nanopillar optical resonator 10 can be used to implement on-chip subwavelength lasers.

As discussed above, while the embodiments of the nanopillar optical resonator 10 illustrated in many of the figures described herein have hexagonal symmetries, the nanopillar optical resonator 10 is not limited thereto. Other types of symmetries (e.g., circular, dodecagonal, or the like) are effectively equivalent. The type of symmetry used is not critical. As an example of another type of symmetry, FIGS. 10A through 10C illustrate electric field profiles of the helically-propagating cavity modes for an embodiment of the nanopillar optical resonator 10 having circular symmetry. As shown, the helically-propagating cavity mode is also achieved in the embodiment of the nanopillar optical resonator 10 having circular symmetry.

It should also be noted that while the embodiments of the nanopillar optical resonator 10 stand vertically on, or are perpendicular to, the surface of the substrate 12, the nanopillar optical resonator 10 is not limited thereto. As illustrated in FIG. 11, the nanopillar optical resonator 10 may alternatively be grown at various angles ($\alpha \neq 0°$) from a line normal to the surface of the substrate 12, which are referred to herein as oblique angles, and still support the helically-propagating cavity mode and even laser oscillation. Helically-propagating cavity modes are strongly supported up to at least $\alpha=70°$. An oblique interface between the substrate 12 and the nanopillar optical resonator 10 acts to introduce a mode cutoff for the helically-propagating cavity modes, which is another way to interpret the strong reflection offered by these unique nanopillar resonances. Thus, an oblique interface can be as effective of a mirror for the helically-propagating cavity modes as a flat interface.

FIGS. 12 through 16C relate to one exemplary, non-limiting implementation of the nanopillar optical resonator 10. In this exemplary implementation, an InGaAs active core 14 is formed by MOCVD in a core-shell growth mode with 12-20% indium composition on a (111) silicon substrate 12. Alternatively, the nanopillar optical resonator 10 may be grown on a (111) facet of a (100) silicon substrate, which would result in the nanopillar optical resonator 10 being grown at an oblique angle ($\alpha$, FIG. 11) from a line normal to the surface of the substrate 12. The growth of the InGaAs active core 14 is followed by a higher bandgap GaAs shell 16 for surface passivation.

FIG. 12 illustrates a process for fabricating the exemplary implementation of the nanopillar optical resonator 10. Note that this process is exemplary and is not intended to limit the scope of the present disclosure. The nanopillar optical resonator 10 may be fabricated using any suitable fabrication process. First, the substrate 12, which in this example is a silicon substrate, is cleaned (step 1000). In one embodiment, the substrate 12 is cleaned with acetone, methanol, and water (e.g., three minutes for each cleaning step). Next, the substrate 12 is deoxidized by a buffered oxide etch (e.g., three minutes) and then mechanically roughened (step 1002). Growth of the nanopillar optical resonator 10 is then carried out in a MOCVD reactor (e.g., an EMCORE D75 MOCVD reactor) (step 1004). More specifically, Tertiarybutylarsine (TBA) is introduced to the reactor at temperatures higher than 200° C. Before growth, in situ annealing at 600° C. is performed (e.g., three minutes). After annealing, the temperature is reduced to the growth temperature, which in this example is 400° C. (e.g., reduced from 600° C. to 400° C. in three minutes, followed by two minutes of temperature stabilization). Triethylgallium (TEGa) and trimethylindium (TMIn) are then introduced to the reactor to begin InGaAs core growth. While growth time may vary depending on desired dimensions, in one example, the growth time is 60 minutes. TMIn mole fractions can be kept constant at $9.86 \times 10^{-7}$, $1.38 \times 10^{-6}$, or $1.73 \times 10^{-6}$ to achieve 12%, 15%, or 20% indium composition, respectively. The TEGa mole fraction is held at $1.12 \times 10^{-5}$. A 12 l min$^{-1}$ hydrogen carrier gas flow is used. The TBA mole fraction is $5.42 \times 10^{-4}$, giving a V/III ratio of ~43. A GaAs shell is then grown around the InGaAs core with the same TEGa and TBA mole fractions used for core growth, with a V/III ratio of 48. Room-temperature lasers may use 90 nm shells with 20% indium cores, and low-temperature lasers may use 30 nm shells and 15% indium cores. Nanopillar growth is vertically aligned to the (111) silicon substrate and is anisotropic with faster growth rates along the [0001] wurtzite c-axis. Nanopillar dimensions are linearly scalable with time, with no critical dimensions.

Due to the formation process, the nanopillar optical resonator 10 has a slight 6° taper between opposite sidewall facets and, in one embodiment, is grown to stand about 3 micrometers (μm) tall (i.e., a length (L) of 3 μm) with a 330 nm base radius (i.e., radius at the interface with the substrate 12). FIG. 3A above highlights the extremely well-faceted geometry of the grown nanopillar optical resonator 10. Note that the taper of the nanopillar optical resonator 10 decreases the quality factor (Q) of the nanopillar optical resonator 10, but the helically-propagating cavity mode is maintained. Other fabrication processes that result in less or no taper may alternatively be used to increase the quality factor (Q) of the nanopillar optical resonator 10. Also note that by utilizing the helically-propagating cavity mode, the nanopillar optical resonator 10 implements a laser on the silicon substrate 12 immediately after growth without need for additional processing that may damage the rest of the silicon substrate 12 and any electronic devices existing on the silicon substrate 12.

As evidenced by vertical alignment to the (111) silicon substrate 12, nanopillar growth is epitaxial and anisotropic with faster growth rates along the wurtzite [0001] c-axis. The top-view of the nanopillar optical resonator 10 shown in the SEM image of FIG. 3B shows the hexagonal cross-section of the nanopillar optical resonator 10, which results from its single crystal wurtzite structure. Importantly, the nanopillar optical resonator 10 is grown at a temperature of 400° C., which is 200-300° C. lower than typical III-V growth temperatures and compatible with CMOS processes. Furthermore, the nanopillar optical resonator 10 forms without use of metal catalysts, which are poisonous to silicon CMOS devices. These exemplary non-limiting advantages combine to greatly simplify integration of the nanopillar optical resonator 10 with well-developed silicon transistor technology, allowing nanopillar optical resonators 10 to leverage the existing silicon infrastructure for low-cost and streamlined fabrication of optoelectronic chips. Additionally, the nanopillar optical resonator 10 possesses a small footprint of only ~0.34 μm$^2$, enabling realization of high-density silicon-based optoelectronics.

To achieve room temperature lasing of the nanopillar optical resonator 10, the nanopillar optical resonator 10 is optically pumped with 120 femtosecond (fs) titanium (Ti)-sapphire pulses to achieve sufficient gain for laser oscillation. Laser operation at room temperature testifies to the high optical quality of the InGaAs nanopillar optical resonator 10. Note that the growth of a 90 nm GaAs shell 16 around the InGaAs active core 14 aids in suppressing surface recombination and achieving room temperature lasing. At low pump levels, the nanopillar optical resonator 10 emits bright and broad spontaneous emission. Under stronger optical excitation, cavity modes and ultimately full laser oscillation can be seen as shown in FIG. 13A. A sharp peak appears and dominates light emission from the nanopillar optical resonator 10 after the onset of lasing. Background suppression ratios as high as 20 decibels (dB) have been obtained at cryogenic temperatures of 4 Kelvin (K). The nanopillar optical resonator 10 may have as many as three lasing modes and typically provides spontaneous emission clamping.

FIG. 13B illustrates wavelength tunability of laser emission from the nanopillar optical resonator 10 by variation of the indium composition. Nanopillar cavity dimensions scale with growth time, and indium composition can be easily tuned during MOCVD growth, allowing the gain of the nanopillar optical resonator 10 (tuned via indium composition) to be matched with cavity resonance (tuned via nanopillar dimensions) for laser operation over a broad wavelength range. Such flexibility allows the nanopillar optical resonator 10 to be utilized in a myriad of laser applications.

To further investigate the cavity properties of the experimentally implemented embodiment of the nanopillar optical resonator 10, a systematic study of over a hundred of the nanopillar optical resonators 10 was performed. FIG. 14 graphically illustrates the dependence of the resonant or lasing wavelength on the radius of the nanopillar optical resonator 10. FIG. 14 experimentally verifies that cavity resonances red shift with base radius, substantiating that WG effects provide optical feedback. Resonances should shift only slightly for modes guided purely along the longitudinal direction of the nanopillar optical resonator 10. As a further testament to the potential of nanopillar lasers for high-density optoelectronics, the inset of FIG. 14 shows an example of a laser that is subwavelength in volume (V~0.2λ$_0^3$). The lasing spectra corresponding to this subwavelength laser are presented in FIG. 15. Though implemented by a purely semiconductor helically-propagating cavity mode, the laser formed by the nanopillar optical resonator 10 provides enough confinement for subwavelength lasing without needing plasmonic or metal-optic effects. Additional experimental corroboration that the nanopillar optical resonator 10 supports helically-propagating cavity modes is shown in FIGS. 16A through 16C. Here, camera images of nanopillar emissions along the nanopillar axis for n=1, n=2, and n=3, respectively, clearly reveal axial standing wave maxima, which is a direct consequence of net propagation of helically-propagating cavity modes along the length (L) of the nanopillar optical resonator 10. FP modes are not responsible for the mode pattern seen because the low index contrast interface between silicon and InGaAs prevents FP standing waves from building.

FIG. 17 illustrates a CMOS chip 18 including a number of CMOS transistors 20 through 24 and a nanopillar optical resonator 10' monolithically integrated onto the CMOS chip 18. In this example, the nanopillar optical resonator 10' is coupled to an on-chip waveguide 26 for optical interconnects.

Note that FIG. 17 is exemplary and is only intended to illustrate that the nanopillar optical resonator 10' can be monolithically integrated onto a chip along with electronic devices, such as the CMOS transistors 20 through 24.

The nanopillar optical resonator 10 described herein may be utilized in many types of applications. As some exemplary, non-limiting examples, the nanopillar optical resonator 10 may be utilized in applications such as nanolasers monolithically integrated onto a chip (e.g., transmitters for optical on-chip interconnects), modulators monolithically integrated onto chips and coupled to on-chip waveguides (e.g., modulators for optical on-chip interconnects), cavity-enhanced photodetectors monolithically integrated onto a chip (e.g., receivers for optical on-chip interconnects), avalanche photodetectors monolithically integrated onto chips (e.g., receivers for on-chip optical interconnects), high-efficiency subwavelength or wavelength-scale optical devices without use of plasmonics or metal-optics, monolithic light-emitting diodes, low-cost, high efficiency displays (e.g., silicon-based displays), low-cost, high-efficiency lighting (e.g., silicon-based lighting), on-chip biological and chemical sensing using cavity resonances, add-drop filters, and solar cells.

Those skilled in the art will recognize improvements and modifications to the preferred embodiments of the present disclosure. All such improvements and modifications are considered within the scope of the concepts disclosed herein and the claims that follow.

What is claimed is:

1. A microelectronic chip comprising:
a substrate; and
a nanopillar optical resonator that is formed directly on the substrate and promotes a helically-propagating cavity mode that results in sufficient internal reflection at an interface of the nanopillar optical resonator and the substrate to support the helically propagating cavity mode.

2. The microelectronic chip of claim 1 wherein the helically-propagating cavity mode comprises both a transverse propagation characteristic and an axial propagation characteristic.

3. The microelectronic chip of claim 1 wherein the helically-propagating cavity mode results in a shallow angle of incidence at an interface of the nanopillar optical resonator and the substrate.

4. The microelectronic chip of claim 1 wherein the shallow angle of incidence is less than or equal to $90°-(\arcsin(n2/n1)\times 180°/\pi)$, where n1 is a refractive index of the nanopillar optical resonator and n2 is a refractive index of the substrate.

5. The microelectronic chip of claim 1 wherein the helically-propagating cavity mode results in at least 30% internal reflection at an interface of the nanopillar optical resonator and the substrate.

6. The microelectronic chip of claim 5 wherein an index of refraction of the nanopillar optical resonator is the same as or similar to an index of refraction of the substrate.

7. The microelectronic chip of claim 1 wherein an index of refraction of the nanopillar optical resonator is the same as or similar to an index of refraction of the substrate.

8. The microelectronic chip of claim 1 wherein transverse dimensions of the nanopillar optical resonator are less than a single wavelength, the single wavelength being an emission wavelength in air of an active material of the nanopillar optical resonator.

9. The microelectronic chip of claim 1 wherein transverse dimensions of the nanopillar optical resonator are on the order of a single wavelength, the single wavelength being an emission wavelength in air of an active material of the nanopillar optical resonator.

10. The microelectronic chip of claim 1 wherein a length of the nanopillar optical resonator is less than or equal to a single wavelength, the single wavelength being an emission wavelength in air of an active material of the nanopillar optical resonator.

11. The microelectronic chip of claim 1 wherein a length of the nanopillar optical resonator is greater than a single wavelength, the single wavelength being an emission wavelength in air of an active material of the nanopillar optical resonator.

12. The microelectronic chip of claim 1 wherein both transverse dimensions and a length of the nanopillar optical resonator are less than a single wavelength, the single wavelength being an emission wavelength in air of an active material of the nanopillar optical resonator.

13. The microelectronic chip of claim 1 wherein the nanopillar optical resonator comprises:
an active core formed of an active material directly on the substrate; and
a shell formed of a shell material over the active core.

14. The microelectronic chip of claim 13 wherein the active material is one of a group consisting of: indium gallium arsenide (InGaAs), an arsenide based Group III-V semiconductor material, a nitrogen based Group III-V semiconductor material, a phosphorous based Group III-V semiconductor material, a Group III-V semiconductor material, zinc oxide (ZnO), and a Group II-V semiconductor material.

15. The microelectronic chip of claim 14 wherein the shell material is a material that passivates a surface of the active core.

16. The microelectronic chip of claim 14 wherein the substrate is one of a group consisting of: a gallium arsenide (GaAs) substrate, an indium phosphide (InP) substrate, a gallium nitride (GaN) substrate, a silicon-on-insulator (SOI) substrate, a sapphire substrate, a glass substrate, a substrate formed of an alloy of GaAs, a substrate formed of an alloy of InP, and a substrate formed of an alloy of GaN.

17. The microelectronic chip of claim 13 wherein the active core has a cylindrical geometry that promotes the helically-propagating cavity mode.

18. The microelectronic chip of claim 17 wherein the cylindrical geometry is one of a group consisting of: a circular cylindrical geometry, a hexagonal cylindrical geometry, and a dodecagonal cylindrical geometry.

19. The microelectronic chip of claim 17 wherein the cylindrical geometry is an N-sided cylindrical geometry, where N is greater than or equal to 3.

20. The microelectronic chip of claim 13 wherein the active core is formed of indium gallium arsenide (InGaAs), the shell is formed of gallium arsenide (GaAs), and the substrate is a silicon substrate.

21. The microelectronic chip of claim 1 wherein dimensions of the nanopillar optical resonator are designed to provide a desired resonant wavelength.

22. The microelectronic chip of claim 1 wherein the nanopillar optical resonator is formed at an oblique angle to a surface of the substrate.

* * * * *